(12) United States Patent
Grunzke

(10) Patent No.: US 8,441,873 B2
(45) Date of Patent: May 14, 2013

(54) MEMORY DEVICES AND METHODS OF OPERATING MEMORY

(76) Inventor: Terry Grunzke, Boise, ID (US)

( * ) Notice: Subject to any disclaimer, the term of this patent is extended or adjusted under 35 U.S.C. 154(b) by 207 days.

(21) Appl. No.: 12/872,587

(22) Filed: Aug. 31, 2010

(65) Prior Publication Data

US 2012/0051161 A1 Mar. 1, 2012

(51) Int. Cl.
*G11C 7/00* (2006.01)

(52) U.S. Cl.
USPC .............................. 365/194; 365/233.1

(58) Field of Classification Search ............ 365/194, 365/233.1
See application file for complete search history.

(56) References Cited

U.S. PATENT DOCUMENTS

| | | | |
|---|---|---|---|
| 6,525,988 B2 * | 2/2003 | Ryu et al. | 365/194 |
| 7,035,366 B2 | 4/2006 | Tokutome et al. | |
| 7,245,551 B2 | 7/2007 | Choi | |
| 7,639,552 B2 | 12/2009 | Ku | |
| 7,656,745 B2 | 2/2010 | Kwak | |
| 7,676,686 B2 | 3/2010 | Ku et al. | |
| 2008/0192563 A1 | 8/2008 | Cho | |
| 2009/0259873 A1* | 10/2009 | Oh | 713/401 |

* cited by examiner

*Primary Examiner* — Son Dinh
*Assistant Examiner* — Nam Nguyen
(74) *Attorney, Agent, or Firm* — Leffert Jay & Polglaze, P.A.

(57) ABSTRACT

Methods and apparatus for synchronizing a delay locked loop, such as delay locked loops used with NAND memories are disclosed. In at least one embodiment, one or both of a clock and the delay locked loop are stopped for energy savings. A synchronization start signal can be provided by the NAND memory or a controller to start the clock and/or delay locked loop, and to synchronize the delay locked loop to the clock before competing the read operation.

37 Claims, 7 Drawing Sheets

MEMORY DEVICES AND METHODS OF OPERATING MEMORY

FIELD

The present disclosure relates generally to memory and in particular, in one or more embodiments, the present disclosure relates to synchronizing in NAND memories.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of a charge storage structure, such as floating gates or trapping layers or other physical phenomena, determine the data state of each cell. Common uses for flash memory include personal computers, personal digital assistants (PDAs), digital cameras, digital media players, digital recorders, games, appliances, vehicles, wireless devices, cellular telephones, and removable memory modules, and the uses for flash memory continue to expand.

Flash memory typically utilizes one of two basic architectures known as NOR flash and NAND flash. The designation is derived from the logic used to read the devices. In NOR flash architecture, a logical column of memory cells is coupled in parallel with each memory cell coupled to a data line, such as those typically referred to as digit (e.g., bit) lines. In NAND flash architecture, a column of memory cells is coupled in series with only the first memory cell of the column coupled to a bit line.

Latency in NAND operations is increasingly becoming an issue as speeds of operation of NAND memories continue to increase. As interface speeds of NAND access increase, output without latency issues is becoming increasingly more difficult. Previously, the relatively long read times for NAND memories, on the order of 25-50 microseconds (μs), allowed for output to readily follow a read. However, as speeds increase, output issues also increase.

For the reasons stated above, and for other reasons stated below which will become apparent to those skilled in the art upon reading and understanding the present specification, there is a need in the art for reducing latency in NAND operations.

DETAILED DESCRIPTION

Figure 1:
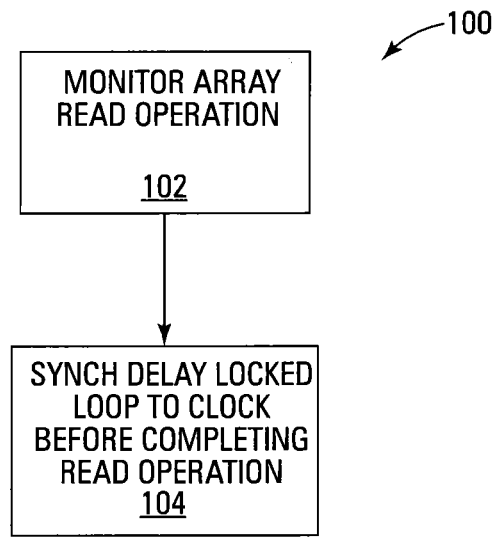
FIG. 1 is a flow chart diagram of an embodiment of the present disclosure.

In the following detailed description of the embodiments, reference is made to the accompanying drawings that form a part hereof. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The following detailed description is, therefore, not to be taken in a limiting sense, and the scope of the present disclosure is defined only by the appended claims, along with the full scope of equivalents to which such claims are entitled.

Latency in NAND operations is increasingly becoming an issue as speeds of operation of NAND memories continue to increase. To provide for faster output from NAND memories, synchronization to an external clock may be accomplished. Synchronization is useful if the frequency of the delay locked loop changes, and to allow for faster data output once an array read operation is completed. Synchronization allows for decreased latency, and energy savings, since the clock and delay locked loop can be stopped when they are not being used. Since NAND can have relatively long read times, especially as compared to DRAM and SDRAM, keeping a clock and DLL running may create a substantial drain on energy. Because of the amount of time used to synchronize a DLL, typically on the order of 256-512 clock cycles (on the order of 2-3 microseconds (μs)), the read times of around 50 μs mean that a DLL and clock can be turned off for a large percentage of an array read time. Synchronization in the various embodiments is accomplished before completion of the array read operation in a NAND memory, so that when the array is ready to output data, latency is short.

One embodiment of a method 100 for reducing latency in a NAND is shown in flow chart form in FIG. 1. Method 100 comprises monitoring an array read operation in a NAND memory in block 102, and synchronizing a delay locked loop of the NAND memory to a clock before completing the read operation in block 104. Monitoring the array read operation and synchronizing a delay locked loop of the memory are described in further detail in various embodiments below.

Figure 2:
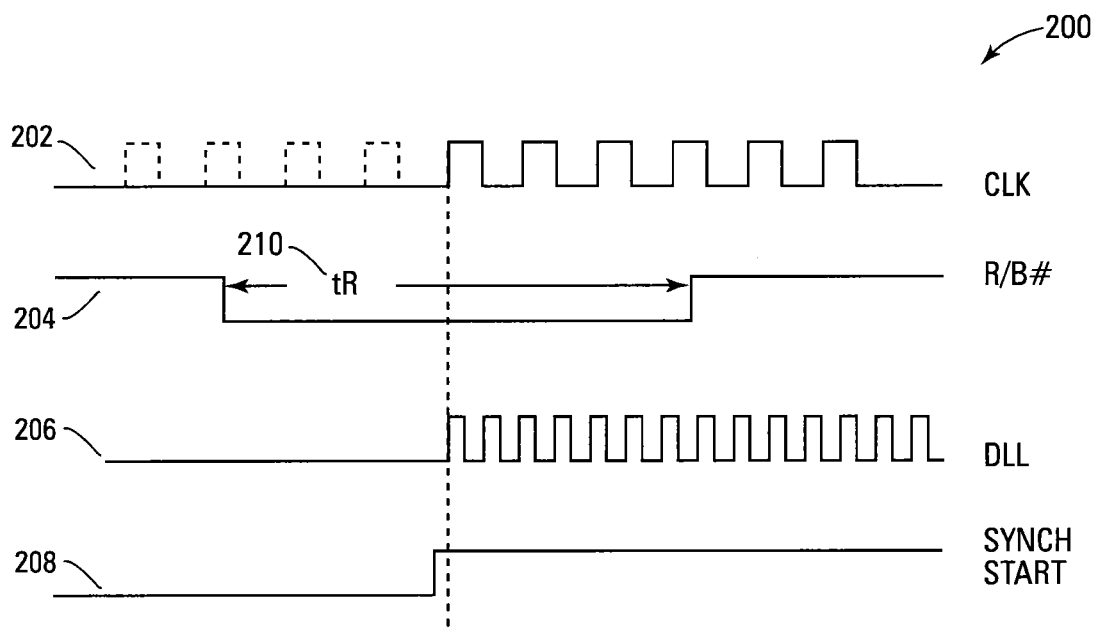
FIG. 2 is a timing diagram for the embodiment shown in FIG. 1.

Referring also to FIG. 2, a timing diagram 200 for one embodiment of monitoring and synchronizing is shown. Timing is shown for a clock 202, a ready/busy signal 204, a delay locked loop 206, and a status indicator 208. The memory array read operation has a typical array read time designated as tR 210. The array read time is typically a function of the parameters of the page or other portion of memory being read. The NAND itself monitors progress of an array read operation, and determines when the array read is nearing completion. This determination is used in one embodiment to set a flag or a bit in a read status register for the memory to indicate that synchronization is to be started.

Array read times vary, but for example, if an array read time is approximately 50 microseconds (µs), a controller for the memory or system using the memory may poll the status using a status read command, for example every 5 µs. A read algorithm within the NAND memory provides the signal to set the synchronization start signal 208 to high, indicating that the array read operation is nearing completion. This starts the synchronization process.

Monitoring, in one embodiment, further comprises monitoring a status indicator such as the synchronization start signal 208 to a memory or system controller responsive to a read status command. The status indicator is, in one embodiment, a status bit in a status register.

Figure 3:
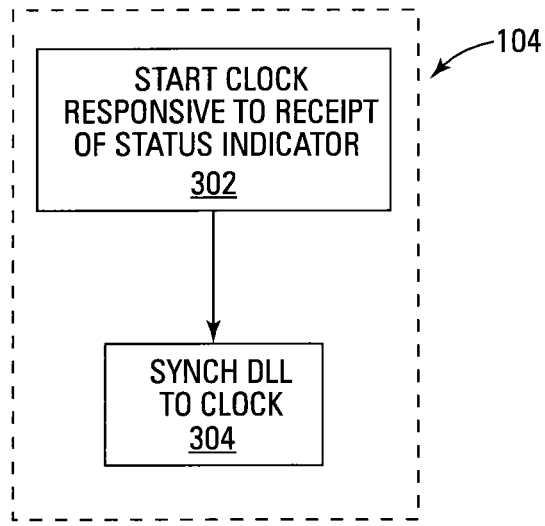
FIG. 3 is a flow chart diagram of another embodiment of the present disclosure.

One embodiment for synchronizing the delay locked loop to a clock is shown in FIG. 3. Synchronization (block 104) in one such embodiment further comprises starting the clock responsive to (e.g., upon) receipt of the status indicator in block 302, and synchronizing the delay locked loop to the clock in block 304. The clock and the delay locked loop are, in one embodiment, each stopped after an array read is completed, to save energy. The synchronization start signal in one such embodiment initiates a startup of both the clock and the delay locked loop, and the synchronization of the DLL to the clock begins. Synchronization of a DLL to a clock will not be described further herein, as the same is well known to those of ordinary skill in the art.

In another embodiment, the clock may be kept running at all times. In one such embodiment, the clock does not need to be started upon receipt of the synchronization start signal 208. Instead, the DLL is started and synchronization to the clock begins.

Figure 4:
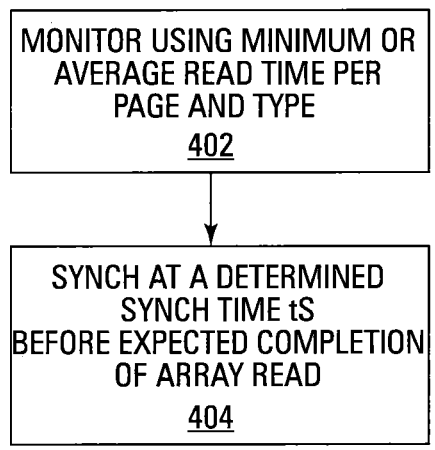
FIG. 4 is a flow chart diagram of still another embodiment of the present disclosure.

In another embodiment 400, which is shown in flow chart form in FIG. 4, the method 100 comprises, using an average array read time per memory page and per memory page type for the NAND memory, monitoring a read time for a current read operation in block 402, and synchronizing the delay locked loop to the clock beginning at a determined synchronization time (tS) before an expected completion of the array read operation in block 404. In one such embodiment, the clock and delay locked loop may also be turned off after an array read operation is complete, and turned back on at a start of synchronization.

Figure 5:
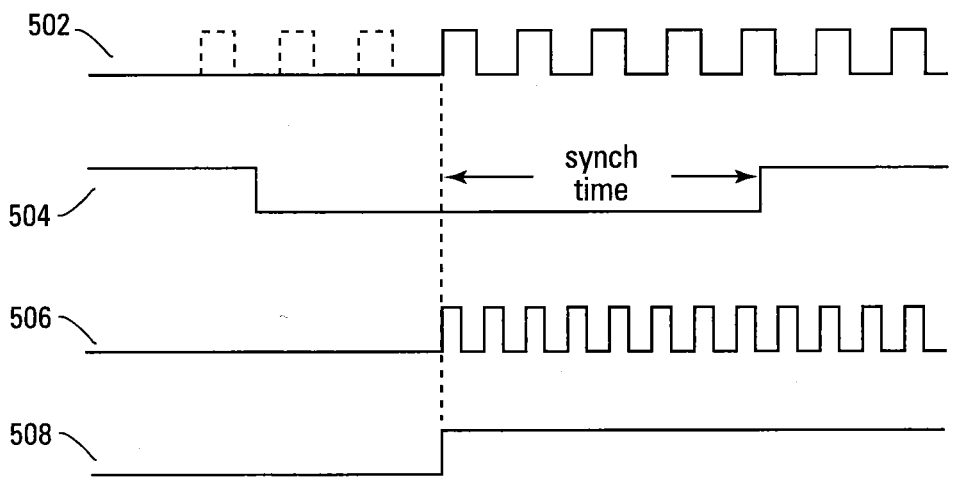
FIG. 5 is a timing diagram for the embodiment shown in FIG. 4.

Further, in one such embodiment, the array read operation is monitored in a different manner than in the embodiment of FIGS. 1-3. A timing diagram for one such embodiment is shown in FIG. 5. In one such embodiment, a memory or system controller uses information from parameters of the NAND memory that are provided to the controller at initialization of the memory. These parameters include typical array read times tR, such as minimum tR, maximum tR, typical tR, and the like. Based on those parameters, and in one embodiment using the minimum tR, the controller can start the clock at a particular time during the array read process. The controller is provided or programmed with, or determines from testing, a synchronization time (tS), that is, a maximum synchronization time, a typical synchronization time, and the like. For increased reliability, the tS may be set at the programmed or determined $tS_{max}$. For further reduced latency, the tS may be set at a typical or average programmed or determined $tS_{avg}$. For even further reduced latency, the tS may be set at a minimum programmed or determined $tS_{min}$.

Figure 6:
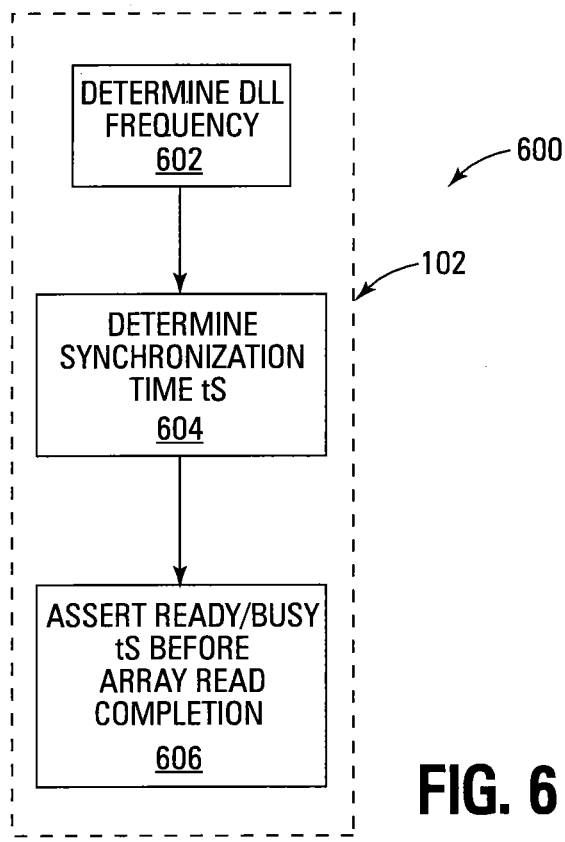
FIG. 6 is a flow chart diagram of yet another embodiment of the present disclosure.

In another embodiment 600, shown in flow chart form in FIG. 6, monitoring of the array read operation is performed by the NAND itself. The NAND in one such embodiment activates its ready/busy signal before an array read is complete, to allow synchronization of the DLL upon assertion of the ready/busy signal. In one such embodiment, the NAND determines a frequency for the DLL in block 602, and based on that frequency, determines a synchronization time in block 604. That synchronization time is the amount of time by which the NAND asserts the ready/busy signal early in block 606 to allow synchronization of the DLL to the clock.

Problems can occur with full assertion of the ready/busy signal before an array read operation is complete. In another embodiment 700, shown in FIG. 7, the NAND again knows that an array read operation is nearing completion. To avoid full assertion of the ready/busy signal before the array read operation is complete, and thus to avoid issues where a controller may attempt to begin retrieval of data before the array is ready, monitoring the array read operation comprises monitoring the ready/busy status in block 702 for activity. In one such embodiment, a trigger to start synchronization is a pulse in the ready/busy signal for a duration of no more than a trigger time (tT), in one embodiment 100 nanoseconds. If the activity on the ready/busy signal is an asserted signal of a duration greater than the trigger time, as determined in block 704, array read begins in block 706. If the activity of the ready/busy signal is instead a pulse of a duration not greater than the trigger time, synchronization is started in block 708, and monitoring for activity continues at block 702. In one such embodiment, a ready/busy pulse of a specific short duration, for example no more than 100 nanoseconds, acts as a trigger to start a synchronization of the DLL to the clock. In one such embodiment, unless the ready/busy signal is active for more than the specific pulse width, the array is not ready, but is nearing readiness, so that synchronization can start.

Figure 7:
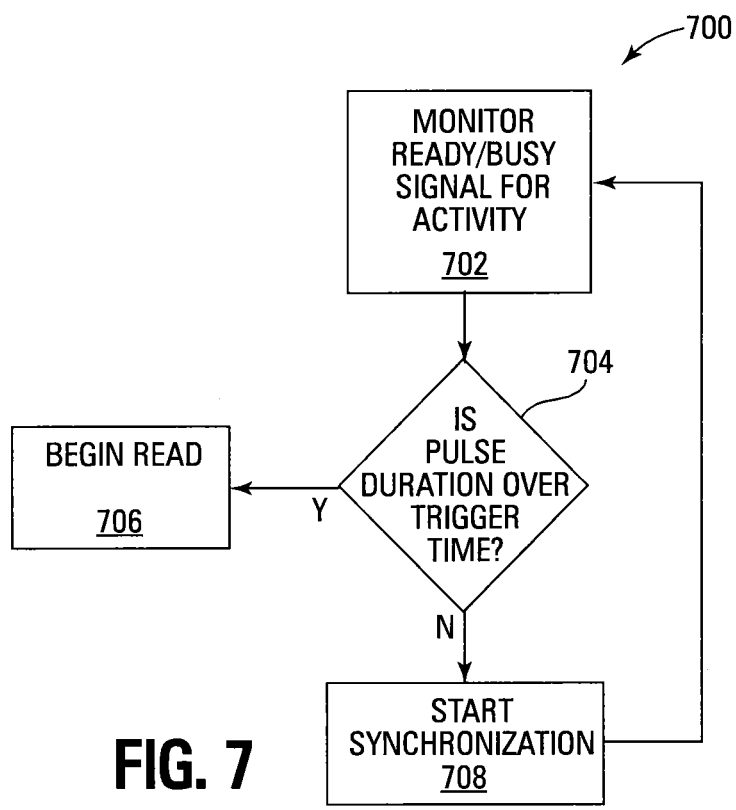
FIG. 7 is a flow chart diagram of another embodiment of the present disclosure.
Figure 8:
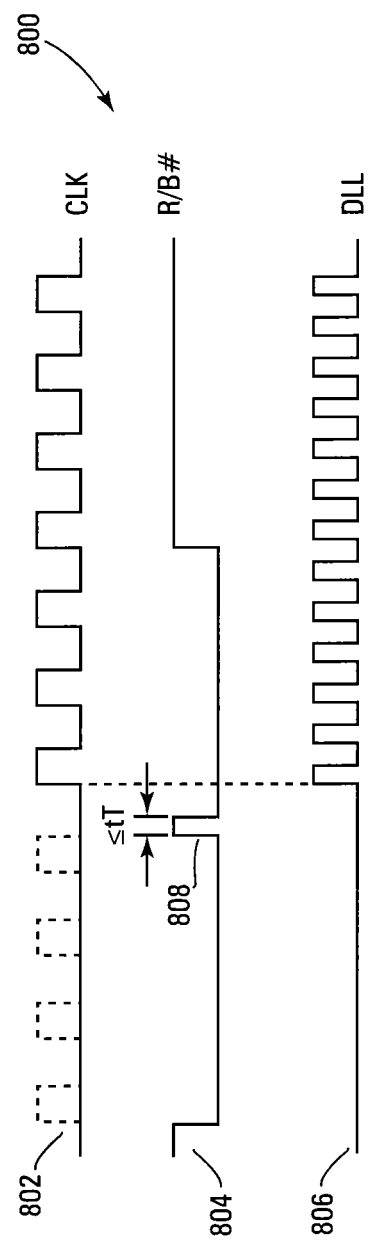
FIG. 8 is a timing diagram for the embodiment shown in FIG. 7.

A timing diagram 800 for the embodiment of FIG. 7 is shown in FIG. 8. Timing is shown for a clock 802, a ready/busy signal 804, and a delay locked loop 806. The memory array read operation has a trigger pulse time tT in one such embodiment of 100 nanoseconds. The NAND itself monitors progress of an array read operation, and determines when the array read is nearing completion. This determination is used in one embodiment to initiate pulse 808 of ready/busy signal 804 to initiate synchronization. The timing for determining when to initiate the pulse 808 may be performed by one of the various embodiments described herein.

Figure 9:
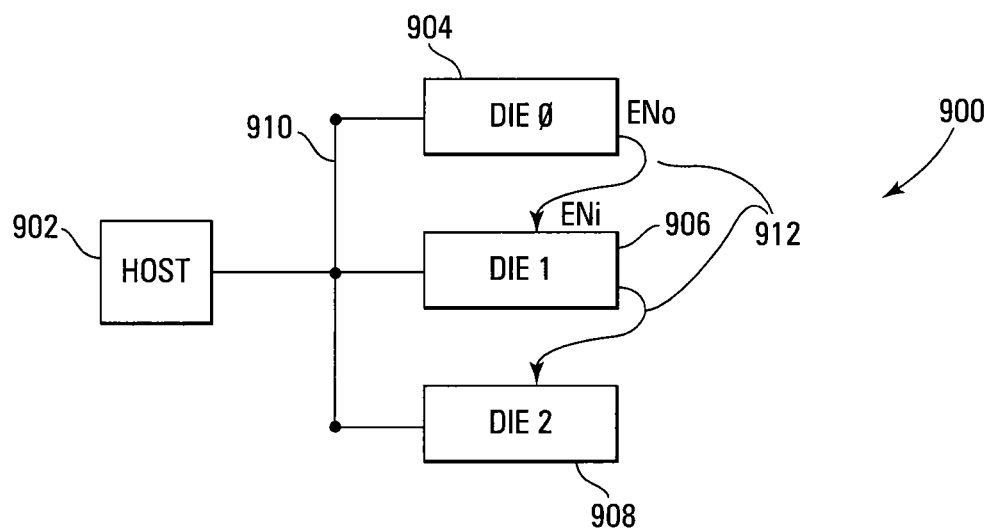
FIG. 9 is a block diagram of another embodiment.

Some NAND flash systems have multiple dies shared on the same data bus. This adds density and allows for parallelism to improve performance. FIG. 9 is a block diagram of an embodiment 900 showing a host (e.g., controller) 902 and a plurality of shared dies DIE0 904, DIE1 906, and DIE2 908, connected to the host 902 on shared data bus 910. If read operation times for the dies, or for a page on a die, are sufficiently long, one or more of the dies, for example DIE1 906, may complete its read operation before another die, for example DIE0 904, has finished with its data output operation after its own read operation, and therefore could have to wait for the first die 904 to finish with its data output operation and its use of the data bus before data output for DIE1 906 may begin. The DLL for the die that is not outputting data but is finished with its read operation, in this example DIE1 906, will not have to use its own DLL or have that DLL synchronized until a time before its data output is to begin, so in one embodiment the DLLs for all dies not currently in a data output operation are not operating. A DLL for a die is synchronized before a data output operation is completed for the previous die in the system.

In operation, a method of synchronizing wherein the memory is on a first die of a multiple die system such as system 900 sharing a common data bus such as data bus 910, either a host such as host 902 or the die that is currently performing a read operation, and more specifically, in one embodiment, is performing a data output operation of a read operation, includes determining when a data output operation after the read operation for the current die data output operation is nearing completion, and synchronizing a second die of the multiple die system responsive to a signal from the first die that its data output operation is nearing completion. Such a signal may be provided in one embodiment as follows. A shared signal, indicated in FIG. 9 as signal ENo/Eni 912 may be used in one embodiment.

Alternatively, the signal indicating that the data output operation of the first die is nearing completion may be provided by a host, such as host 902, in communication with the first and second dies. Such a signal may be provided in various embodiments as follows. In one embodiment, a host, such as host 902, notifies DIE1 906 when DIE0 904 is nearing completion of the data output operation of the read operation by stopping transfer of data for a time and issuing a command to DIE1 906 to synchronize its DLL. In another embodiment, a host, such as host 902, notifies DIE1 906 using signals that are unique to DIE1 906 to synchronize its DLL.

It should be understood that while three dies are shown for illustrative purposes, additional or fewer dies may be used without departing from the scope of the disclosure. Synchronization of a second or subsequent die in a multiple die system such as system 900 may be performed using any of the synchronization methods described herein with respect to FIGS. 1-8.

Figure 10:
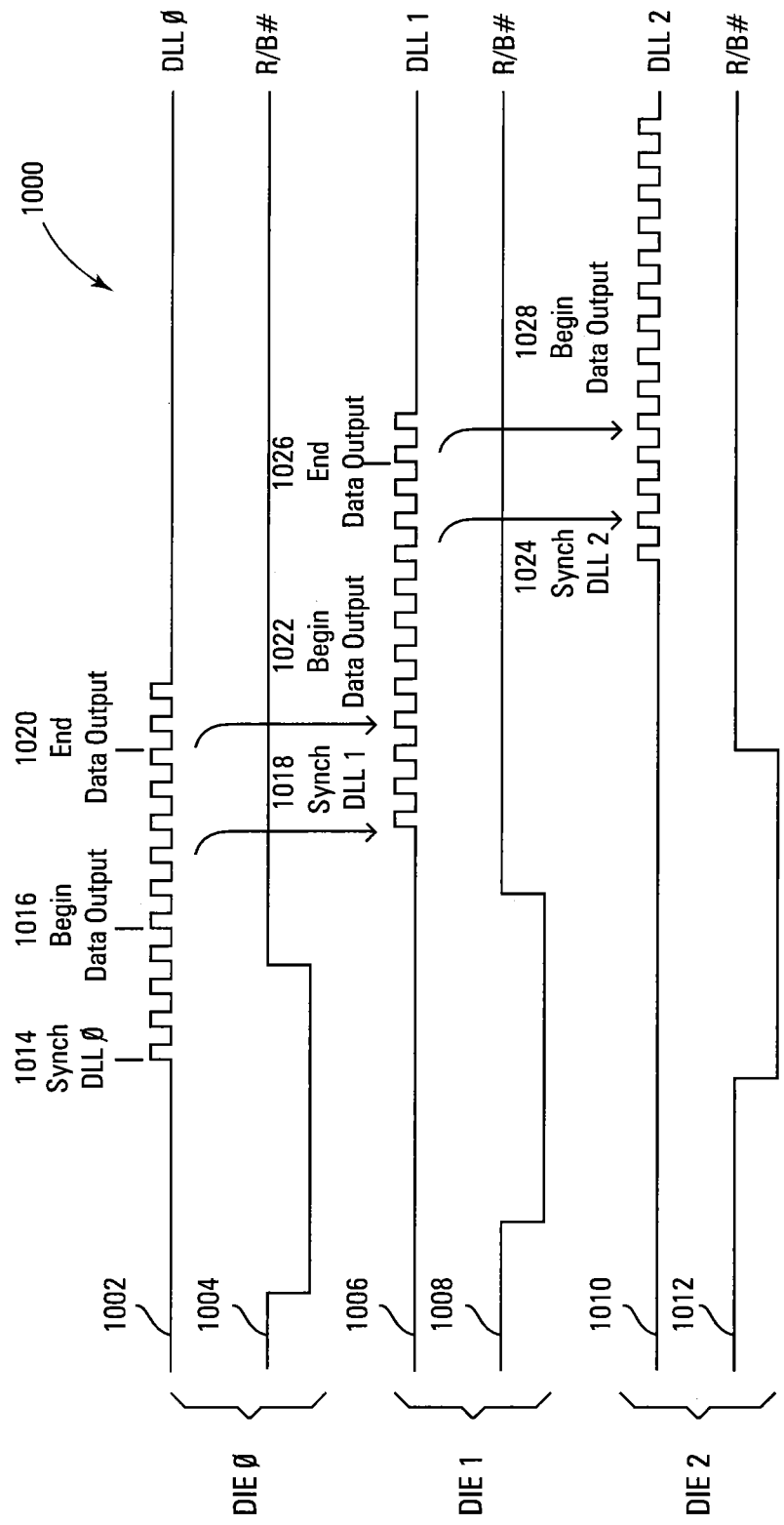
FIG. 10 is a timing diagram for the embodiment shown in FIG. 9.

A timing diagram 1000 for the embodiment 900 is shown in FIG. 10. Timing is shown for a DLL 1002 and ready/busy signal 1004 of a first die (DIE0), a DLL 1006 and ready/busy signal 1008 of a second die (DIE1), and a DLL 1010 and ready/busy signal 1012 of a third die (DIE2). DLL synchronization for DLL0 is begun at point 1014, and the data output operation for DIE0 begins at point 1016. When the data output operation for DIE0 is nearing completion (as determined by any of the methods described above with respect to FIGS. 1-8), a signal is sent to DIE1 at point 1018 to synchronize DLL1. As has been mentioned, this signal can alternatively be provided by a host such as host 902. At point 1020, the data output operation for DIE0 ends and the data output operation for DIE1 begins at point 1022, DIE1's DLL having been synchronized starting at point 1018.

When the data output operation for DIE1 is nearing completion (as determined by any of the methods described above with respect to FIGS. 1-8), a signal is sent to DIE2 at point 1024 to synchronize DLL2. As has been mentioned, this signal can alternatively be provided by a host such as host 902. At point 1026, the data output operation for DIE1 ends and the data output operation for DIE2 begins at point 1028, DIE2's DLL having been synchronized starting at point 1024. The process continues for each die of a multiple die system, or for each die of the multiple due system that is performing read and data output operations.

Figure 11:
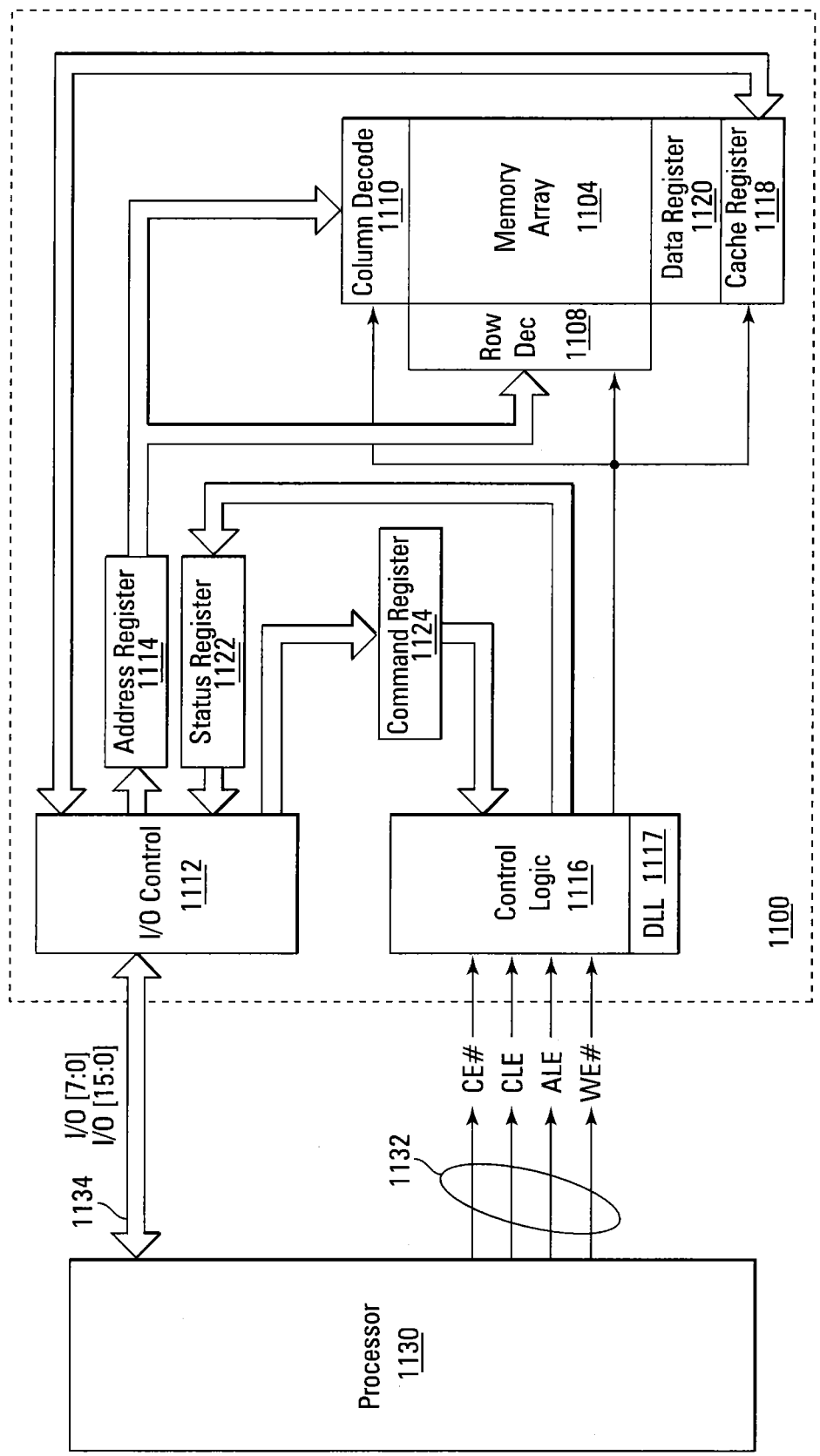
FIG. 11 is a functional block diagram of an electrical system having at least one memory device with a memory array configuration according to one embodiment of the present invention.

FIG. 11 is a simplified block diagram of a memory device 1100, as one example of an integrated circuit device, in communication with (e.g., coupled to) a controller 1130 as part of an electronic system, according to an embodiment of the disclosure. Some examples of electronic systems include personal computers, personal digital assistants (PDAs), digital cameras, digital media players, digital recorders, games, appliances, vehicles, wireless devices, cellular telephones and the like. The controller 1130 may be, for example, a memory controller or other external processor for use in the control and access of the memory device 1100.

Memory device 1100 includes an array of memory cells 1104 logically arranged in rows and columns. The memory device is not limited to NAND devices. Some examples of other array architectures suitable for the present embodiments include NOR arrays, AND arrays or other arrays.

A row decode circuitry 1108 and a column decode circuitry 1110 are provided to decode address signals. Row decode circuitry 1108 contains one or more transistors in accordance with embodiments of the disclosure. Address signals are received and decoded to access memory array 1104. Memory device 1100 also includes input/output (I/O) control circuitry 1112 to manage input of commands, addresses and data to the memory device 1100 as well as output of data and status information from the memory device 1100. An address register 1114 is coupled between I/O control circuitry 1112 and row decode circuitry 1108 and column decode circuitry 1110 to latch the address signals prior to decoding. A command register 1124 is coupled between I/O control circuitry 1112 and control logic 1116 to latch incoming commands. Control logic 1116 controls access to the memory array 1104 in response to the commands and generates status information for the external controller 1130. The control logic 1116 is coupled to row decode circuitry 1108 and column decode circuitry 1110 to control the row decode circuitry 1108 and column decode circuitry 1110 in response to the addresses.

Control logic 1116 is also coupled to a cache register 1118. Cache register 1118 latches data, either incoming or outgoing, as directed by control logic 1116 to temporarily store data while the memory array 1104 is busy writing or reading, respectively, other data. During a write operation, data is passed from the cache register 1118 to data register 1120 for transfer to the memory array 1104; then new data is latched in the cache register 1118 from the I/O control circuitry 1112. During a read operation, data is passed from the cache register 1118 to the I/O control circuitry 1112 for output to the external controller 1130; then new data is passed from the data register 1120 to the cache register 1118. A status register 1122 is coupled between I/O control circuitry 1112 and control logic 1116 to latch the status information for output to the controller 1130. Status register in one embodiment contains the status indicator bit as described above.

Memory device 1100 receives control signals at control logic 1116 from controller 1130 over a control link 1132. The control signals may include a chip enable CE#, a command latch enable CLE, an address latch enable ALE, and a write enable WE#. Memory device 1100 receives command signals (which represent commands), address signals (which represent addresses), and data signals (which represent data) from controller 1130 over a multiplexed input/output (I/O) bus 1134 and outputs data to controller 1130 over I/O bus 1134.

Specifically, the commands are received over input/output (I/O) pins [7:0] of I/O bus 1134 at I/O control circuitry 1112 and are written into command register 1124. The addresses are received over input/output (I/O) pins [7:0] of bus 1134 at I/O control circuitry 1112 and are written into address register 1114. The data are received over input/output (I/O) pins [7:0] for an 8-bit device or input/output (I/O) pins [15:0] for a 96-bit device at I/O control circuitry 1112 and are written into cache register 1118. The data are subsequently written into data register 1120 for programming memory array 1104. For another embodiment, cache register 1118 may be omitted, and the data are written directly into data register 1120. Data are also output over input/output (I/O) pins [7:0] for an 8-bit device or input/output (I/O) pins [15:0] for a 16-bit device. In various embodiments, memory device 1100 includes or is coupled to circuitry for control and/or access of the memory cells 1104, such as control circuitry 1112 and/or controller 1130 to implement methods such as those described above with respect to FIGS. 1-10. The memory device 1100 also includes a delay locked loop 1117 configured to operate as described herein.

It will be appreciated by those skilled in the art that additional circuitry and signals can be provided, and that the memory device of FIG. 11 has been simplified. It should be recognized that the functionality of the various block components described with reference to FIG. 11 may not necessarily be segregated to distinct components or component portions of an integrated circuit device. For example, a single component or component portion of an integrated circuit device could be adapted to perform the functionality of more than one block component of FIG. 11. Alternatively, one or more components or component portions of an integrated circuit device could be combined to perform the functionality of a single block component of FIG. 11.

Additionally, while specific I/O pins are described in accordance with popular conventions for receipt and output of the various signals, it is noted that other combinations or numbers of I/O pins may be used in the various embodiments.

Conclusion

Methods of reading a memory and memories using the methods have been described that, among other things, provide for timing of synchronization of a delay locked loop to a clock in NAND memories. Synchronization includes embodiments monitoring an array read operation in a NAND memory, and synchronizing delay locked loop of the NAND memory to a clock before completion of the read operation.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is intended that this disclosure be limited only by the claims and the equivalents thereof.

What is claimed is:

1. A method, comprising:
monitoring a read operation in a memory; and
synchronizing a delay locked loop of the memory to a clock with a ready/busy signal activated approximately a synchronization time before an expected completion of the read operation.

2. The method of claim 1, wherein monitoring comprises:
monitoring a status indicator responsive to a read status command.

3. The method of claim 2, wherein the status indicator is a status bit in a status register.

4. The method of claim 2, wherein synchronizing comprises:
starting the clock responsive to the status indicator; and
starting the delay locked loop responsive to the status indicator.

5. The method of claim 2, wherein the status indicator comprises a synchronization start signal.

6. The method of claim 2, wherein the status indicator comprises a flag.

7. The method of claim 2, wherein synchronizing comprises starting the delay locked loop responsive to the status indicator.

8. The method of claim 1, and comprising:
stopping the clock and the delay locked loop after the read operation is complete.

9. The method of claim 8, wherein synchronization further comprises:
starting the clock and the delay locked loop when synchronization for a next read operation begins.

10. The method of claim 1, wherein monitoring comprises:
providing to a controller a read time parameter of the memory.

11. The method of claim 10, wherein synchronizing comprises starting the clock at a particular time during the read operation based on the read time parameter.

12. The method of claim 1, wherein synchronization comprises synchronizing the delay locked loop to the clock with the ready/busy signal beginning at approximately a maximum synchronization time before the read operation is complete.

13. The method of claim 1, wherein synchronization comprises synchronizing the delay locked loop to the clock with the ready/busy signal beginning at approximately a minimum synchronization time before the read operation is complete.

14. The method of claim 1, wherein synchronization comprises synchronizing the delay locked loop to the clock with the ready/busy signal beginning at approximately an average synchronization time before the read operation is complete.

15. The method of claim 1, wherein the synchronization time is based on a frequency of the delay locked loop.

16. The method of claim 1, wherein synchronization is started when a trigger pulse is presented as the ready/busy signal on a ready/busy pin, the trigger pulse only responsive to a pulse in the synchronization signal having a duration of no more than a trigger time.

17. The method of claim 1, wherein monitoring the read operation comprises monitoring progress of the read operation and determining when the read operation is nearing completion.

18. The method of claim 1, wherein synchronizing comprises starting synchronization after starting the read operation and responsive to the ready/busy signal.

19. The method of claim 1, wherein monitoring comprises monitoring by the memory.

20. The method of claim 1, wherein monitoring comprises monitoring by a controller.

21. A method, comprising:
monitoring a read operation in a memory; and
synchronizing a delay locked loop of the memory to a clock before completing the read operation, wherein synchronizing comprises:
synchronizing the delay locked loop with the clock responsive to a pulse of a ready/busy signal, the pulse of a duration less than a trigger time.

22. A method, comprising:
monitoring a read operation in a memory; and
synchronizing a delay locked loop of the memory to a clock before completing the read operation, wherein monitoring comprises monitoring a read time of the read operation using an average array read time per memory page and per memory page type for the memory; and
wherein synchronizing comprises synchronizing the delay locked loop to the clock beginning at a determined synchronization time before an expected completion of the read operation.

23. The method of claim 22, wherein synchronizing comprises:
starting the clock and the delay locked loop at a start of synchronizing.

24. A method, comprising:
monitoring a read operation in a memory; and
synchronizing a delay locked loop of the memory to a clock before completing the read operation, wherein the memory is on a first die of a multiple die system sharing a common data bus, and further comprising:

determining when a first die data output operation after its read operation is nearing completion; and synchronizing a DLL of the second die responsive to a signal to the second die that the data output operation of the first die is nearing completion.

25. The method of claim 24, wherein the signal to the second die is a signal provided by the first die.

26. The method of claim 25, wherein the signal provided by the first die is provided using a signal shared by the first and the second dies.

27. The method of claim 24, wherein the signal to the second die is a signal provided by a controller.

28. The method of claim 27, wherein the signal provided by the controller is provided by stopping the data output operation of the first die, starting synchronization of the second die DLL, and continuing the data output operation of the first die.

29. The method of claim 27, wherein the signal provided by the controller is provided using a signal unique to the second die.

30. A method, comprising:
stopping operation of a delay locked loop and a clock in a memory after completion of a read operation;
monitoring a subsequent read operation in the memory;
starting the delay locked loop and the clock upon receipt of a start signal; and
synchronizing the delay locked loop to the clock before completing the read operation.

31. The method of claim 30, wherein the start signal comprises a status indicator.

32. The method of claim 31, wherein the status indicator is a status bit in a status register.

33. A method, comprising:
stopping operation of a delay locked loop and a clock in a memory after completion of a read operation;
monitoring a subsequent read operation in the memory;
starting the delay locked loop and the clock upon receipt of a start signal; and
synchronizing the delay locked loop to the clock before completing the read operation, wherein the start signal comprises a command from a controller to start synchronization at a time before the read operation completion, the time determined using an average array read time per memory page and per memory page type for the memory.

34. A method, comprising:
stopping operation of a delay locked loop and a clock in a memory after completion of a read operation;
monitoring a subsequent read operation in the memory;
starting the delay locked loop and the clock upon receipt of a start signal; and
synchronizing the delay locked loop to the clock before completing the read operation, wherein the start signal comprises a trigger pulse presented on a ready/busy pin, the trigger pulse having a duration of no more than a determined trigger time.

35. A method, comprising:
stopping operation of a delay locked loop and a clock in a memory after completion of a read operation;
monitoring a subsequent read operation in the memory;
starting the delay locked loop and the clock upon receipt of a start signal; and
synchronizing the delay locked loop to the clock before completing the read operation, wherein the memory is on a first die of a multiple die system sharing a common data bus, and further comprising:
determining when a first die data output operation after its read operation is nearing completion; and
synchronizing a DLL of the second die responsive to a signal to the second die that the data output operation of the first die is nearing completion.

36. A memory device, comprising:
an array of memory cells;
a delay locked loop for synchronization to a clock; and
circuitry for control and/or access of the array of memory cells, the control circuitry configured to perform a method comprising:
monitoring a read operation in a memory; and
synchronizing the delay locked loop of the memory to the clock with a ready/busy signal activated approximately a synchronization time before an expected completion of the read operation.

37. A memory device, comprising:
an array of memory cells;
a delay locked loop for synchronization to a clock; and
circuitry for control and/or access of the array of memory cells, the control circuitry configured to perform a method comprising:
monitoring a read operation in a memory; and
synchronizing the delay locked loop of the memory to the clock before completing the read operation, wherein the array of memory cells is on a first die of a multiple die system sharing a common data bus, and wherein the circuitry is further configured to:
determine when a first die data output operation after its read operation is nearing completion; and
synchronize a DLL of the second die responsive to a signal to the second die that the data output operation of the first die is nearing completion.

* * * * *